(12) United States Patent
Watanabe et al.

(10) Patent No.: US 10,645,823 B2
(45) Date of Patent: May 5, 2020

(54) ELECTRONIC DEVICE

(71) Applicant: DENSO TEN Limited, Kobe-shi, Hyogo (JP)

(72) Inventors: Nobutaka Watanabe, Kobe (JP); Yasuaki Takeda, Kobe (JP); Toshihiko Fujii, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 16/275,914

(22) Filed: Feb. 14, 2019

(65) Prior Publication Data

US 2019/0313538 A1   Oct. 10, 2019

(30) Foreign Application Priority Data

Apr. 9, 2018  (JP) .................................. 2018-074802

(51) Int. Cl.
*H05K 5/00* (2006.01)

(52) U.S. Cl.
CPC ........... *H05K 5/006* (2013.01); *H05K 5/0052* (2013.01)

(58) Field of Classification Search
USPC ......................................................... 361/759
See application file for complete search history.

(56) References Cited

U.S. PATENT DOCUMENTS

| | | | | | |
|---|---|---|---|---|---|
| 5,383,098 | A | * | 1/1995 | Ma ....................... | H04B 1/3833 174/371 |
| 5,418,685 | A | * | 5/1995 | Hussmann ........... | H05K 1/0209 174/377 |
| 5,475,566 | A | * | 12/1995 | Rada .................... | H05K 5/0013 361/736 |
| 5,550,712 | A | * | 8/1996 | Crockett ................ | H05K 7/142 174/564 |
| 5,574,254 | A | * | 11/1996 | Mori ..................... | H02G 3/088 174/561 |
| 6,242,690 | B1 | * | 6/2001 | Glover ................. | H05K 9/0037 174/367 |
| 7,008,240 | B1 | * | 3/2006 | Wang ................... | H05K 5/0217 361/737 |
| 7,358,438 | B2 | * | 4/2008 | Zoller ................. | B60R 16/0239 174/50 |
| 9,597,790 | B2 | * | 3/2017 | Moschella ............. | A45C 13/10 |
| 9,821,935 | B2 | * | 11/2017 | Fujii .................. | B65D 43/0233 |
| 2011/0315580 | A1 | * | 12/2011 | Abe ..................... | H05K 7/1417 206/320 |
| 2018/0014418 | A1 | * | 1/2018 | Kang .................. | H05K 5/0047 |

FOREIGN PATENT DOCUMENTS

| | | |
|---|---|---|
| JP | H09-326567 A | 12/1997 |
| JP | 2012-164843 A | 8/2012 |
| JP | 2016-189371 A | 11/2016 |

* cited by examiner

*Primary Examiner* — Hung S. Bui
(74) *Attorney, Agent, or Firm* — Oliff PLC

(57) ABSTRACT

An electronic device includes: a circuit board; a case within which the circuit board is provided and which has a plurality of first contact parts to contact with the circuit board; a cover which has a plurality of second contact parts to contact with the circuit board; a hook part which is provided to one of the case and the cover; and a receiving part which is provided to other of the case and the cover and which corresponds to the hook part, and the hook part engages with the receiving part, whereby the cover is fitted onto the case and the plurality of first contact parts of the case and the plurality of second contact parts of the cover hold and fix the circuit board interposed therebetween.

4 Claims, 9 Drawing Sheets

ELECTRONIC DEVICE

CROSS-REFERENCE TO RELATED APPLICATIONS

This application is based on and claims priority under 35 USC 119 from Japanese Patent Application No. 2018-074802 filed on Apr. 9, 2018.

FIELD OF THE INVENTION

The present invention relates to an electronic device.

BACKGROUND OF THE INVENTION

An electronic device such as an electronic control unit (ECU) mounted on a vehicle includes a circuit board having elements such as a microcomputer, a case in which the circuit board is disposed, and a cover which forms a storage space together with the case. The circuit board is disposed in the case, and is fixed to the case with screws (for example, Japanese Patent Application Laid-Open No. 2016-189371).

SUMMARY OF THE INVENTION

Recently, a demand that such electronic devices be thinned has been increasing. In the case of fixing the circuit board to the case with screws, when the cover is assembled with the case, the heads of the screws interfere with the cover. Therefore, it becomes difficult to thin the electronic device. Further, in the case of fixing the circuit board to the case with screws, if the electronic device is thinned, it becomes difficult to secure the depth for screw holes. Moreover, in the case of fixing the circuit board to the case with screws, the screws may protrude from the bottom the case.

An object of the present invention is to provide an electronic device which can be easily thinned.

An electronic device of the invention comprises: a circuit board; a case within which the circuit board is provided and which has a plurality of first contact parts to contact with the circuit board; a cover which has a plurality of second contact parts to contact with the circuit board; a hook part which is provided to one of the case and the cover; and a receiving part which is provided to other of the case and the cover and which corresponds to the hook part, wherein the hook part engages with the receiving part, whereby the cover is fitted onto the case and the plurality of first contact parts of the case and the plurality of second contact parts of the cover hold and fix the circuit board interposed therebetween.

Preferably, a clearance for preventing interference between the case and the cover from occurring when the hook part engage with the receiving part is provided between the case and the cover.

Preferably, cavities are formed in the plurality of first contact parts of the case and the plurality of second contact parts of the cover, respectively.

Preferably, the shortest distance between the hook part and one of the plurality of first contact parts closest to the hook part is smaller than a dimension of the closest first contact part.

Preferably, the hook part is formed from an elastically deformable material, and in a state where the hook part engages with the receiving part, whereby the cover is fixed to the case, by a biasing force caused by a reaction force attributable to an elastic deformation of the hook part, a pressing force toward the circuit board is applied to the plurality of second contact parts of the cover.

According to the present invention, it is possible to easily thin an electronic device.

DETAILED DESCRIPTION OF THE INVENTION

An embodiment of an electronic device according to the present invention will be described with reference to the drawings. In the present embodiment, the electronic device according to the present invention is realized as an electronic device such as an ECU.

Figure 1:
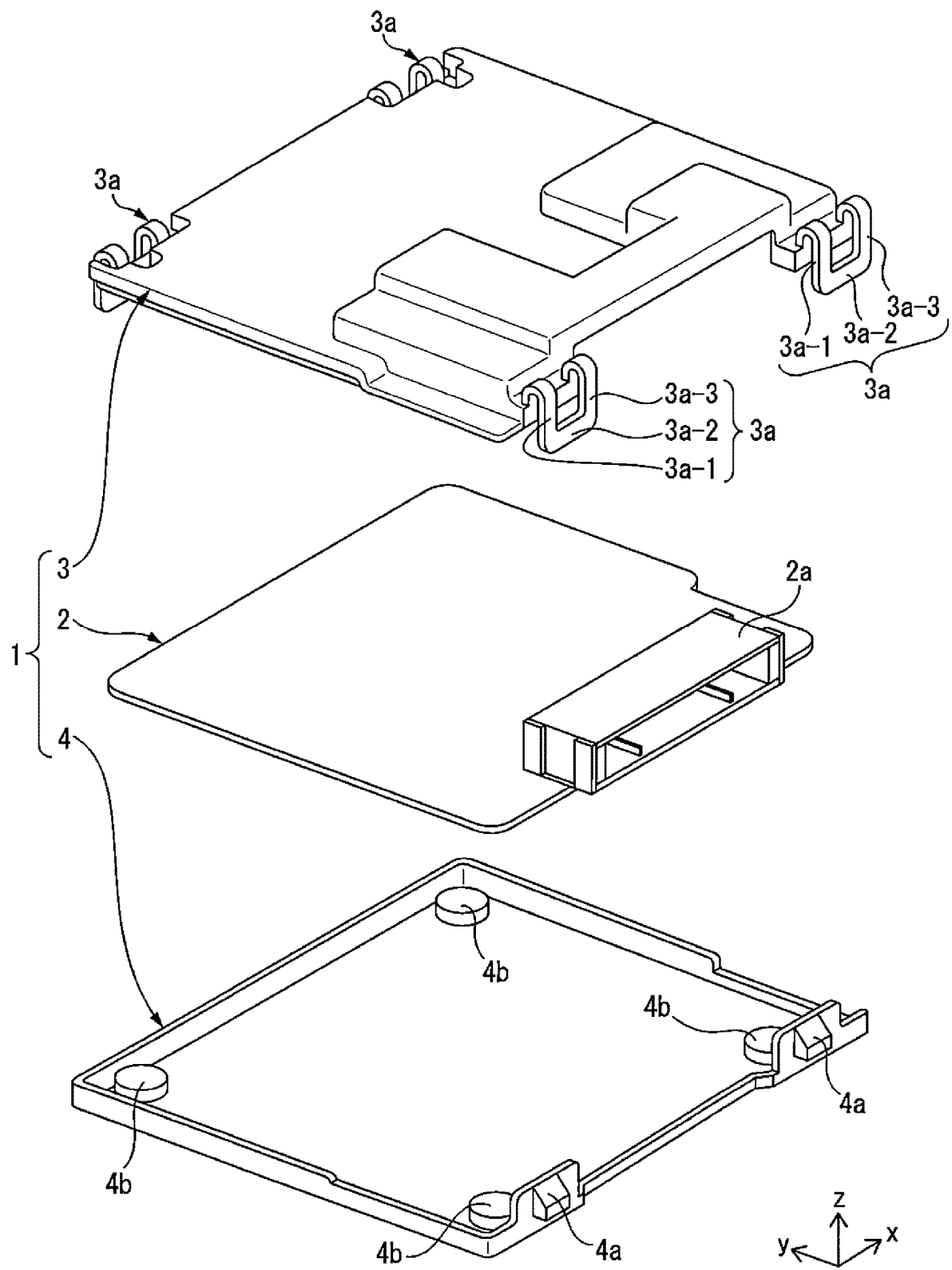
FIG. 1 is an exploded perspective view illustrating an electronic device 1 according to the present invention.

FIG. 1 is an exploded perspective view illustrating an electronic device 1 according to the present invention. In FIG. 1, the electronic device 1 includes a circuit board 2, a cover 3, and a case 4.

The circuit board 2 is rectangular, and is provided within the case 4. In the present embodiment, the circuit board 2 has elements such as a microcomputer (not shown in the drawings), and a connector 2a which a counterpart connector provided at the leading end of a cable can be inserted into and be removed from. The connector 2a holds terminals for electric connection with the elements provided on the circuit board 2.

Figure 2:
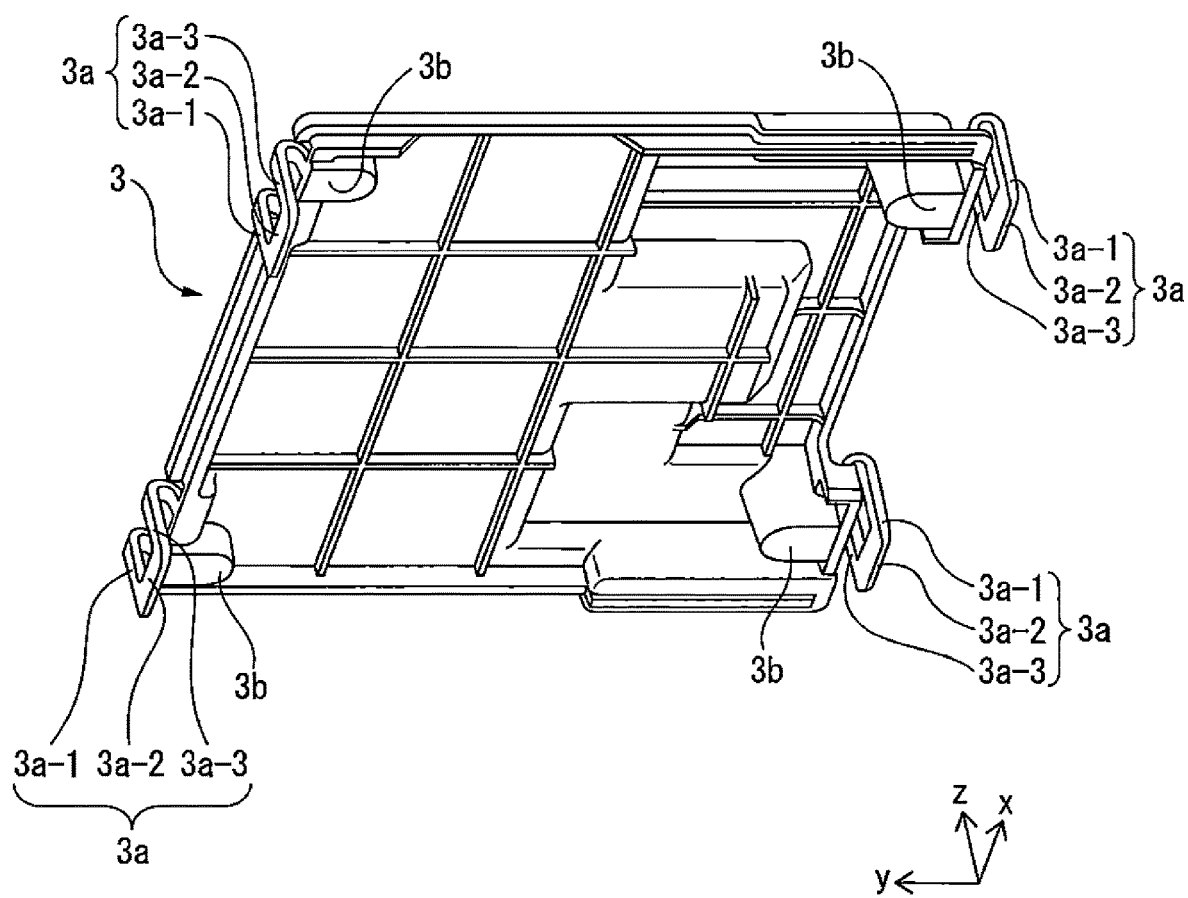
FIG. 2 is a perspective view illustrating the back side of a cover 3 of FIG. 1.

The cover 3 is formed from an elastically deformable material such as a resin. FIG. 2 is a perspective view illustrating the cover 3 of FIG. 1 as seen from the back side. The cover 3 has four engaging claws 3a provided on side parts, and four bosses 3b protruding toward the case 4 so as to contact with the circuit board 2. The four engaging claws 3a are provided at four corners of the cover 3, respectively, and have substantially a U-shape. In other words, each engaging claw 3a has an extension part 3a-1 which has one end connected to a side part of the cover 3 and extends in a negative z direction, an extension part 3a-2 which has one end connected to the other end of the extension part 3a-1 and extends in a positive x direction, and an extension part 3a-3 which has one end connected to a side part of the cover 3 and extends in the negative z direction and is connected to the other end of the extension part 3a-2. The engaging claws 3a are an example of the hook part. The four bosses 3b are formed on four corners of the cover 3, respectively, and have substantially a cylindrical shape. The four bosses 3b are an example of a plurality of contact parts.

The case 4 is formed with metallic materials such as aluminum die castings and an elastically deformable material such as a resin, and forms a space for storing the circuit board 2, together with the cover 3. The case 4 has four claw receiving parts 4a provided on side parts so as to correspond to the four engaging claws 3a, and four bosses 4b protruding toward the cover 3 so as to correspond to the bosses 3b, respectively. The four claw receiving parts 4a are formed on four corners of the cover 3, respectively, and have a protrusion shape corresponding to the shape of the engaging claws 3a such that the engaging claws 3a can engage with the corresponding claw receiving parts 4a. The claw receiving parts 4a are an example of the receiving part. The four bosses 4b are formed on four corners of the case 4, respectively, and have substantially a cylindrical shape. The four bosses 4b are an example of a plurality of first contact parts.

In the present embodiment, each of the pairs of the bosses 3b and the bosses 4b have the same central axis, and the engaging claws 3a engage with the corresponding claw receiving parts 4a, whereby the cover 3 is fitted onto the case 4, and the bosses 4b of the case 4 and the corresponding bosses 3b of the cover 3 hold and fix the circuit board 2 interposed therebetween.

Figure 3:
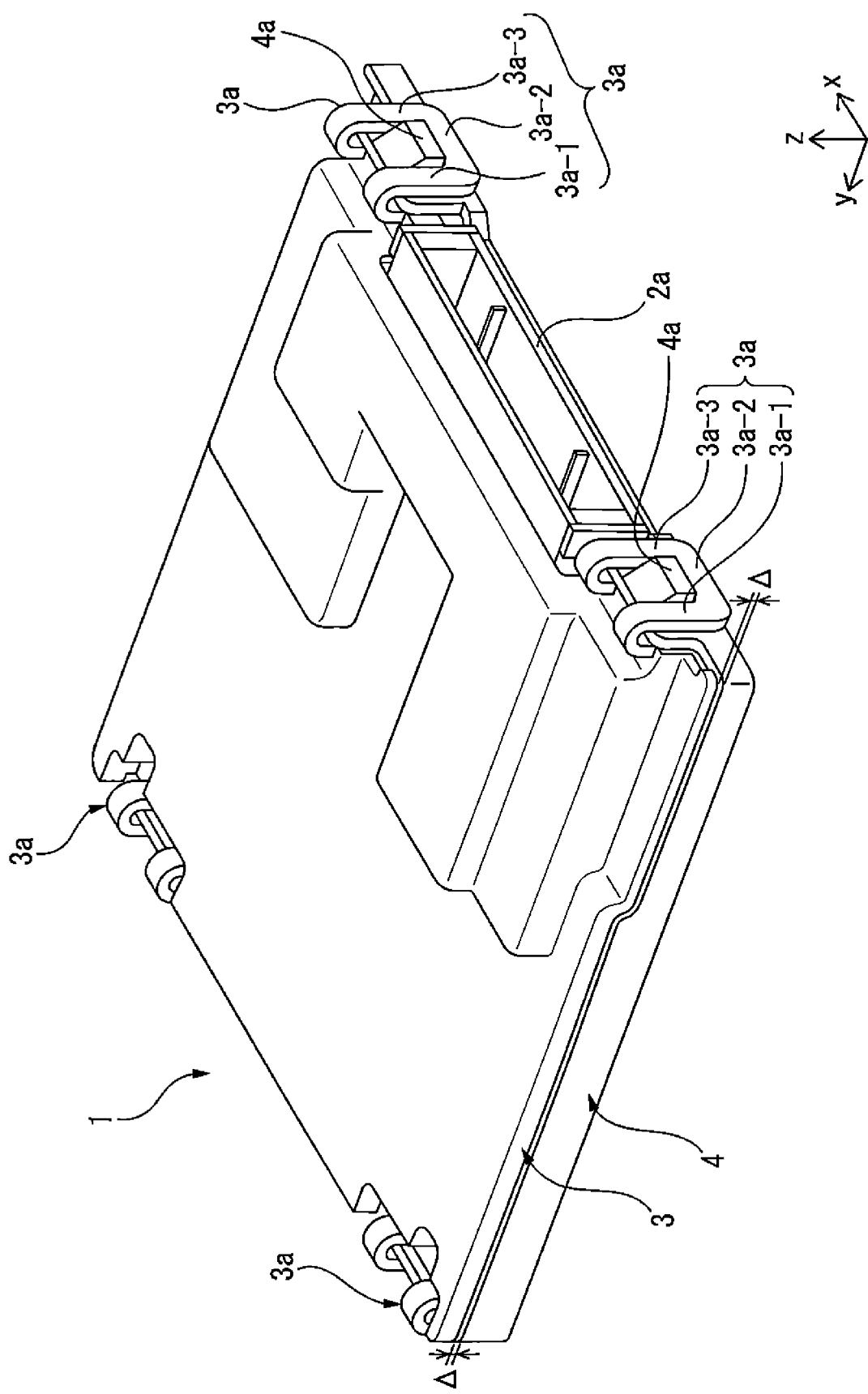
FIG. 3 is a perspective view illustrating the front side of the electronic device 1 according to the present invention.
Figure 4:
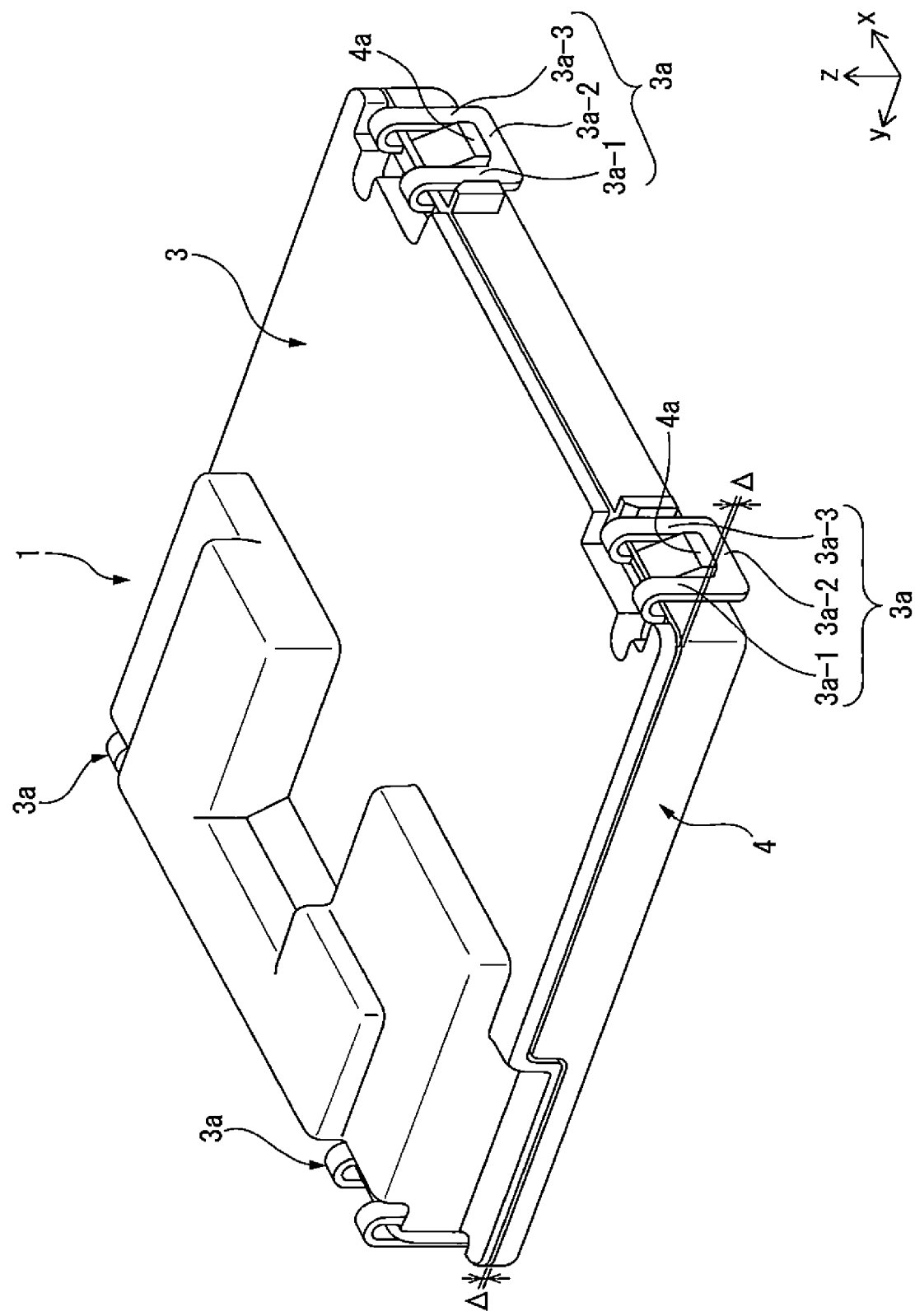
FIG. 4 is a perspective view illustrating the rear side of the electronic device 1 according to the present invention.
Figure 5:
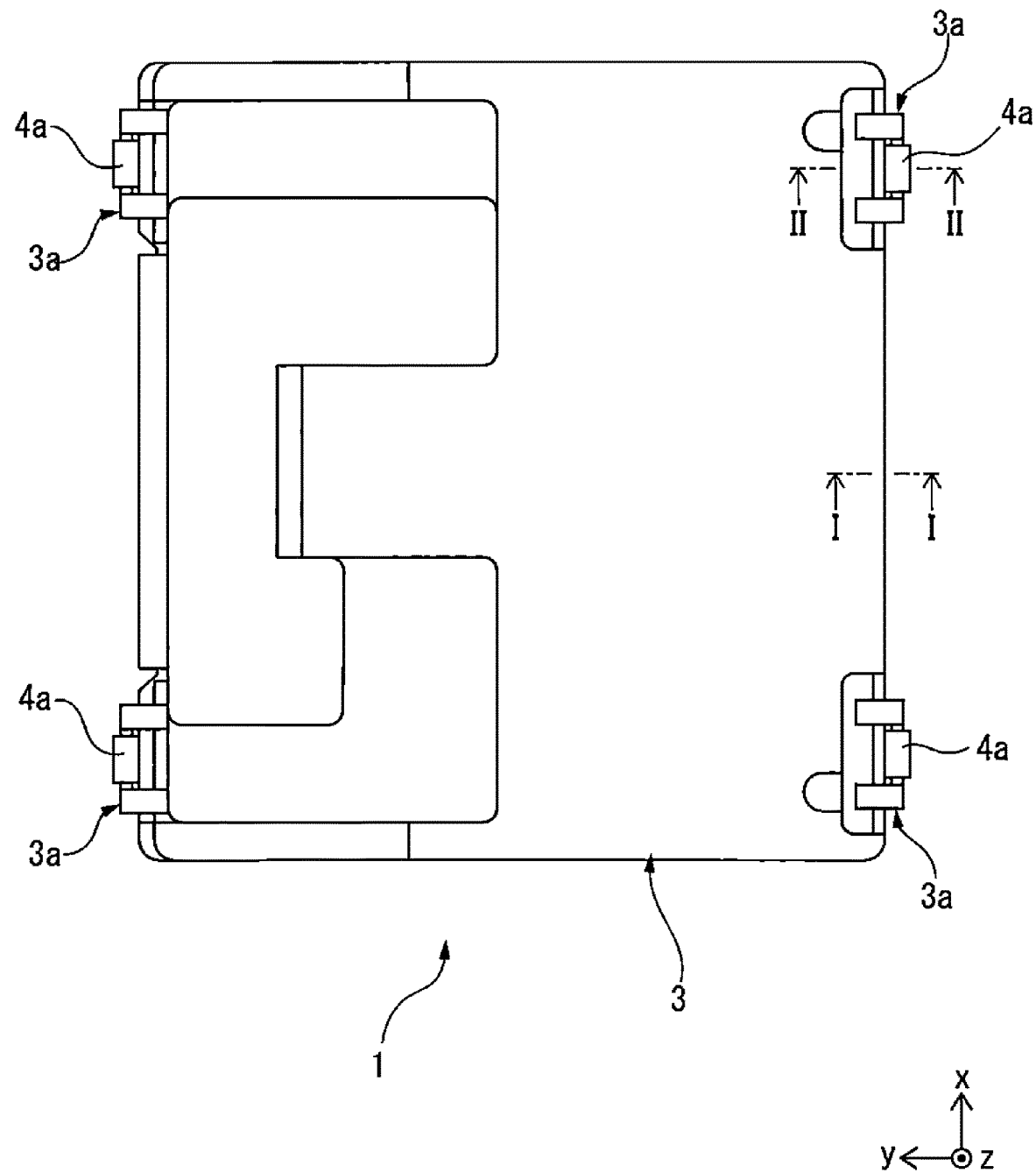
FIG. 5 is a top view illustrating the electronic device 1 according to the present invention.
Figure 6:
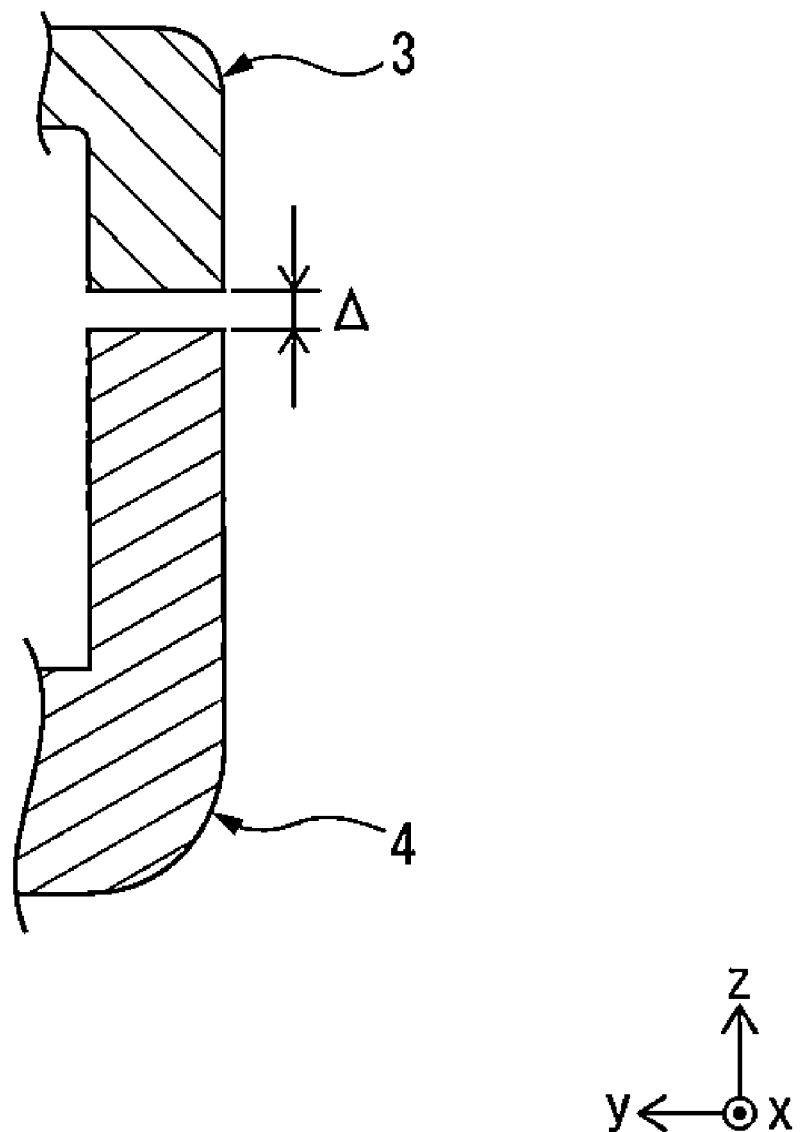
FIG. 6 is a cross-sectional view taken along a line I-I of FIG. 5.

FIG. 3 is a perspective view illustrating the front side of the electronic device 1 according to the present invention, and FIG. 4 is a perspective view illustrating the back side of the electronic device 2 according to the present invention, and FIG. 5 is a top view illustrating the electronic device 1 according to the present invention, and FIG. 6 is a cross-sectional view taken along a line I-I of FIG. 5. In the case where the engaging claws 3a engage with the corresponding claw receiving parts 4a, whereby the surface of the cover 3 facing the case 4 and the surface of the case 4 facing the cover 3 come into contact with each other, variation in at least one of the thickness of the circuit board 2, the height of the bosses 3b, and the thickness of the bosses 4b may cause interference between the cover 3 and the case 4. In the present embodiment, as shown in FIG. 3, FIG. 4, and FIG. 6, in order to prevent interference between the cover 3 and the case 4 when the engaging claws 3a engage with the corresponding claw receiving parts 4a, a clearance having an interval A is provided between the cover 3 and the case 4 over the entire circumference of the electronic device 1.

Figure 7:
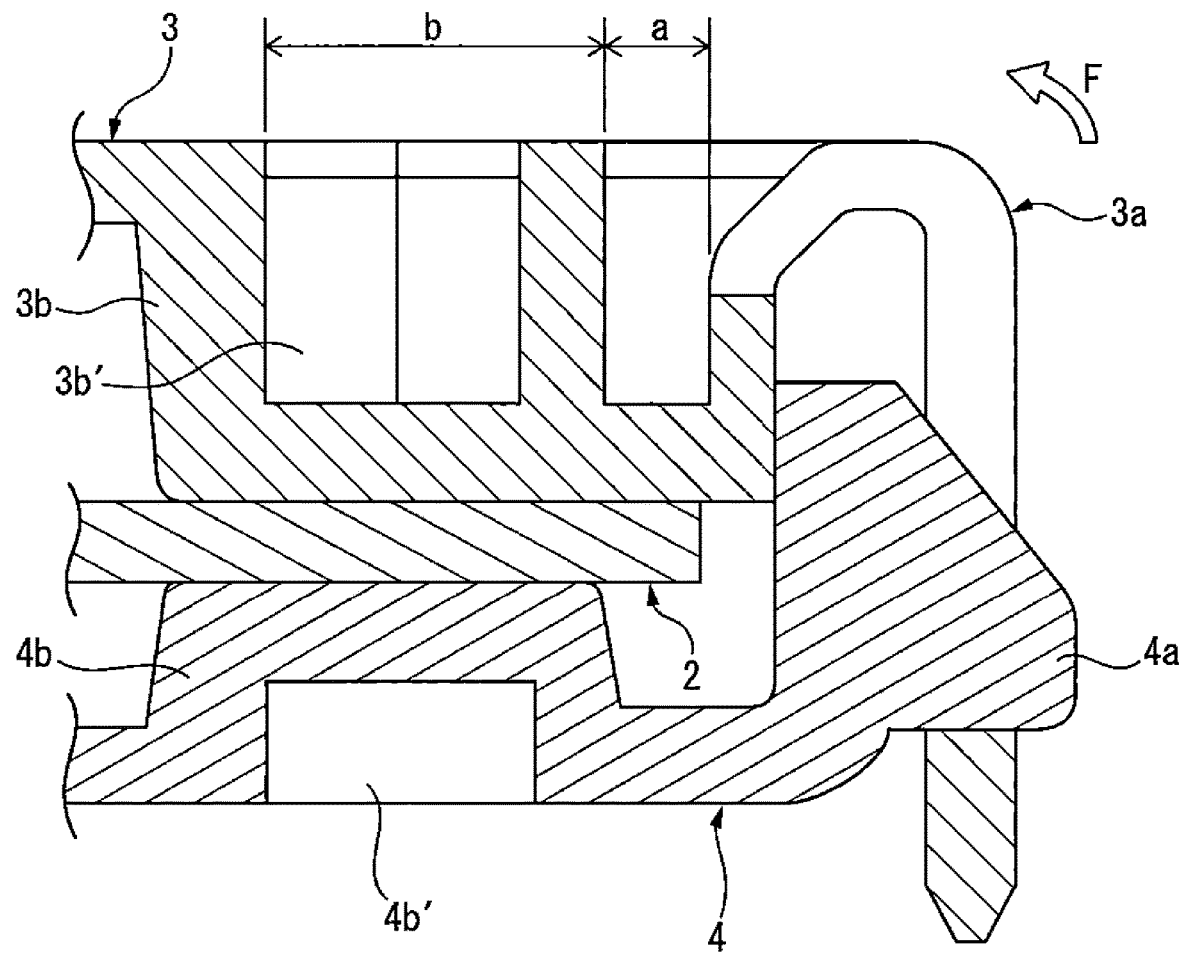
FIG. 7 is a cross-sectional view taken along a line II-II of FIG. 5.

FIG. 7 is a cross-sectional view taken along a line II-II of FIG. 5. As shown in FIG. 7, in a state where the engaging claws 3a have engaged with the claw receiving parts 4a, whereby the cover 3 has been fixed to the case 4, pressing forces toward the circuit board 2 in the negative z direction (hereinafter, referred to as the pressing forces toward the circuit board 2) are applied to the bosses 4b by a biasing force F caused by a reaction force attributable to elastic deformation. As a result, the bosses 3b and the corresponding bosses 4b hold and fix the circuit board 2 interposed therebetween.

In the present embodiment, as shown in FIG. 7, in the four bosses 3b, cavities 3b' are formed, respectively, and in the four bosses 4b, cavities 4b' are formed, respectively. Also, in the present embodiment, as shown in FIG. 7, the shortest distance "a" between the engaging claw 3a and a boss 3b closest to the engaging claw 3a is smaller than the diameter "b" of the closest boss 3b. The diameter "b" is an example of the dimension of the closest first contact part.

Figure 8:
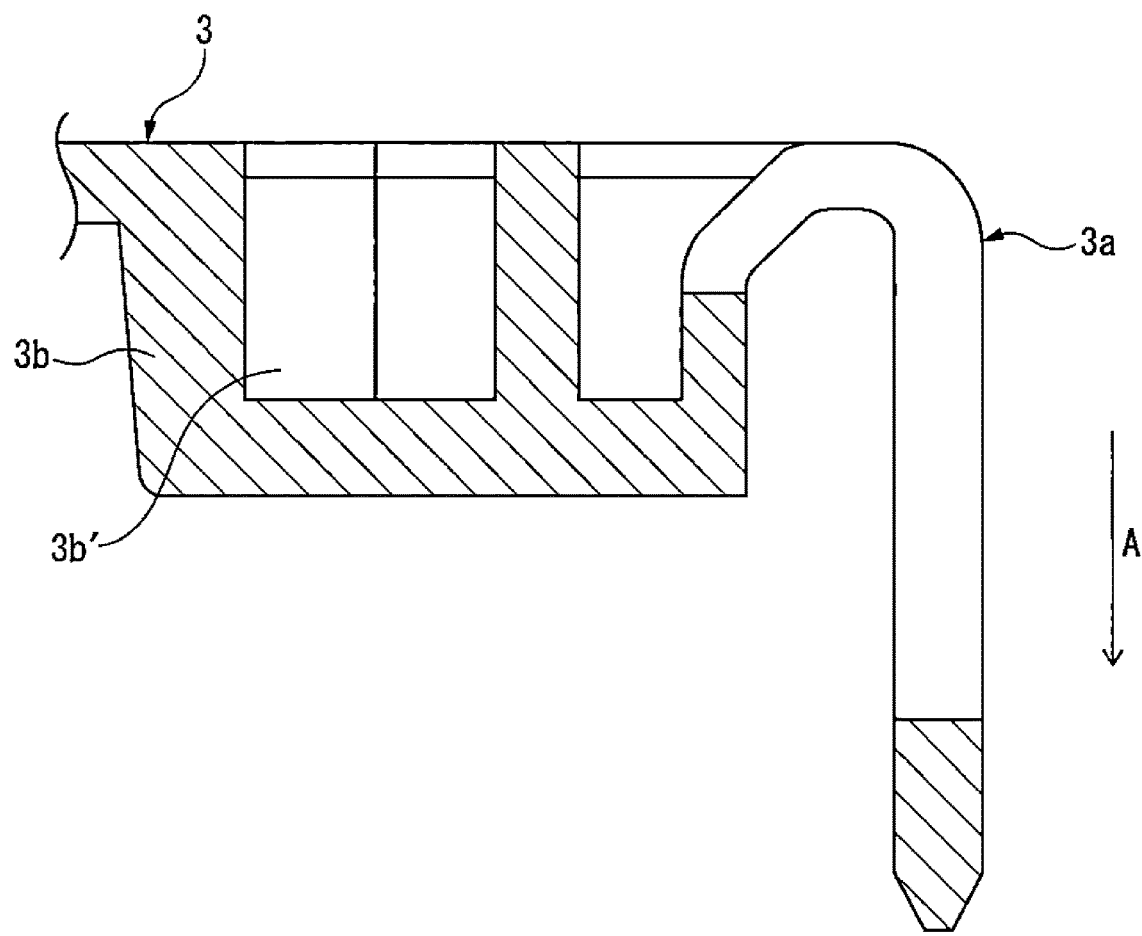
FIG. 8 is a view for explaining fixing of a circuit board 2 of FIG. 1.
Figure 8:
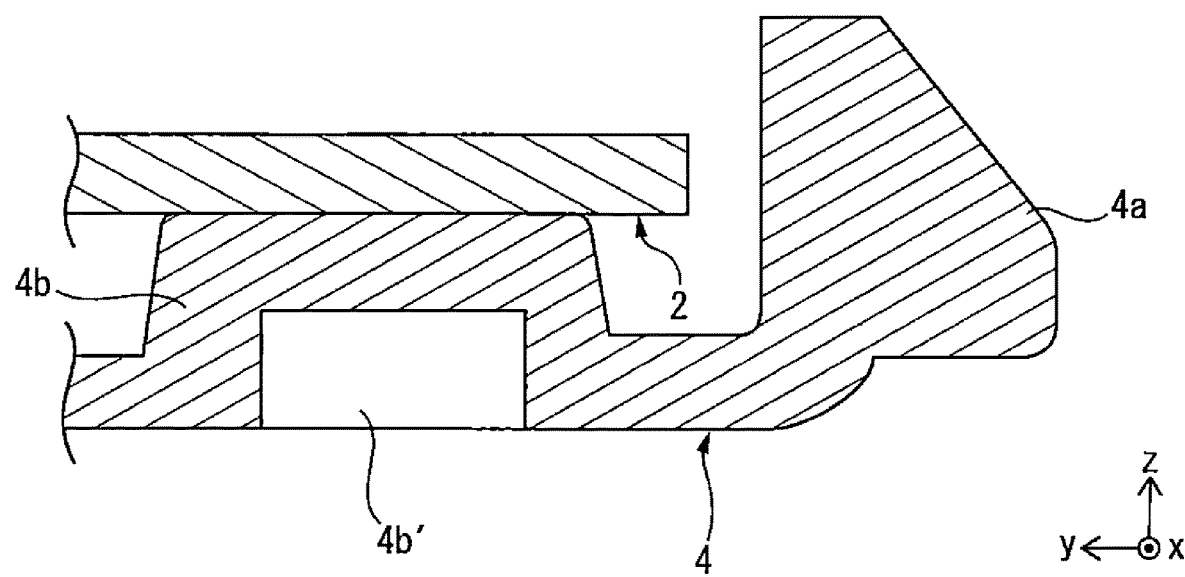
Figure 9:
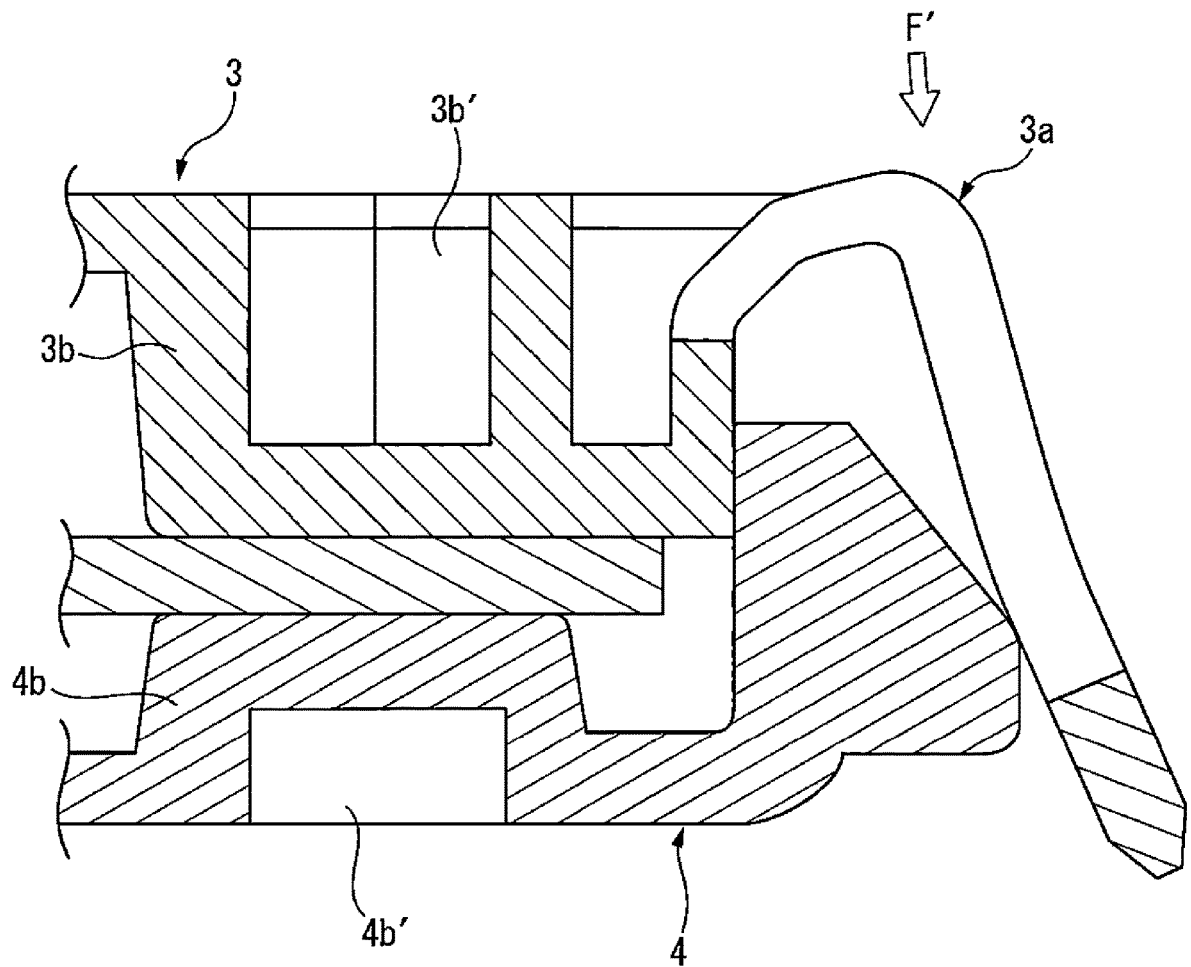
FIG. 9 is a view for explaining fixing of the circuit board 2 of FIG. 1.

FIG. 8 and FIG. 9 are views for explaining fixing of the circuit board 2 of FIG. 1. As shown in FIG. 8, if the cover 3 is moved in a direction shown by an arrow "A" (the negative z direction), the extension parts 3a-2 of the engaging claws 3a come into contact with the corresponding claw receiving parts 4a, and the extension parts 3a-1 and 3a-3 of the engaging claws 3a elastically deform, resulting in the state as shown in FIG. 9. Thereafter, as shown in FIG. 7, the engaging claws 3a engage with the corresponding claw receiving parts 4a.

According to the present embodiment, since the engaging claws 3a engage with the corresponding claw receiving parts 4a, whereby the cover 3 is fitted onto the case 4 and the bosses 4b of the case 4 and the corresponding bosses 3b of the cover 3 hold and fix the circuit board 2 interposed therebetween, it is possible to fix the circuit board 2 in the electronic device 1 without using screws. Therefore, it is possible to easily thin the electronic device 1, and it becomes possible to reduce the manufacturing cost of the electronic device 1 and make the electronic device 1 lighter. Also, since the bosses 3b and the corresponding bosses 4b have the same center axes, the circuit board 2 is prevented from being warped or twisted due to misalignment between the bosses 3b and the corresponding bosses 4b.

Also, since the clearance is provided between the cover 3 and the case 4, interference between the cover 3 and the case 4 is prevented from occurring when the engaging claws 3a engage with the corresponding claw receiving parts 4a. Therefore, it is possible to prevent the pressing forces toward the circuit board 2 from decreasing.

Since the cavities 3b' are formed in the bosses 3b, it is possible to prevent the bosses 3b from deforming when the cover 3 is formed. Further, since the cavities 3b' are formed in the bosses 3b, the bosses 3b uniformly apply the pressing forces toward the circuit board 2 to the circuit board 2. Therefore, it is possible to secure sufficient flatness.

Similarly, since the cavities 4b' are formed in the bosses 4b, it is possible to prevent the bosses 4b from deforming when the cover 45 is formed. Further, since the cavities 4b' are formed in the bosses 4b, the bosses 4b uniformly apply the pressing forces toward the circuit board 2 to the circuit board 2. Therefore, it is possible to secure sufficient flatness.

Also, since the shortest distance "a" between each engaging claw 3a and a boss 3b closest to the corresponding engaging claw 3a is set to be smaller than the diameter "b" of the corresponding boss 3b, the cover 3 is prevented from being warped when the engaging claws 3a engage with the corresponding claw receiving parts 4a. Therefore, since the pressing forces are prevented from being absorbed by warping of the cover 3, it is possible to prevent the pressing forces toward the circuit board 2 from decreasing.

Further, since the engaging claws 3a are formed from an elastically deformable material, it is possible to secure enough pressing forces toward the circuit board 2 to fix the circuit board 2 in the electronic device 1.

The present invention is not limited to the above-described embodiment, and a variety of changes and modifications can be made. For example, the engaging claws 3a may be formed in a shape other than the substantial U-shape, and the claw receiving parts 4a may be formed in a protrusion shape corresponding to the shape of the engaging claws 3a. Also, instead of the bosses 3b and the bosses 4b, contact parts having any other shape such as a substantially quadrangular prism shape may be formed. Also, besides the four bosses 3b, one or more additional bosses may be formed on the cover 3, and other additional bosses corresponding to those bosses may be formed on the case 4. Also, the engaging claws 3a may be formed on side parts of the case 4, and the claw receiving parts 4a may be formed on the cover 3.

What is claimed is:

1. An electronic device comprising:

a circuit board;

a case within which the circuit board is provided and which has a plurality of first contact parts to contact with the circuit board;

a cover which has a plurality of second contact parts to contact with the circuit board;

a hook part which is provided to one of the case and the cover; and a receiving part which is provided to other of the case and the cover and which corresponds to the hook part, wherein the hook part engages with the receiving part, whereby the cover is fitted onto the case and the plurality of first contact parts of the case and the plurality of second contact parts of the cover hold and fix the circuit board interposed therebetween, wherein a clearance for preventing interference between the case and the cover from occurring when the hook part engages with the receiving part is provided between the case and the cover over an entire circumference of the electronic device, and wherein a shortest distance between the hook part and one of the plurality of first contact parts closest to the hook part is smaller than a dimension of the closest first contact part.

2. The electronic device according to claim 1, wherein cavities are provided in the plurality of first contact parts of the case and the plurality of second contact parts of the cover, respectively.

3. The electronic device according claim 1, wherein the hook part is formed from an elastically deformable material, and in a state where the hook part engages with the receiving part, whereby the cover is fixed to the case, by a biasing force caused by a reaction force attributable to an elastic deformation of the hook part, a pressing force toward the circuit board is applied to the plurality of second contact parts of the cover.

4. The electronic device according claim 2, wherein the hook part is formed from an elastically deformable material, and in a state where the hook part engages with the receiving part, whereby the cover is fixed to the case, by a biasing force caused by a reaction force attributable to an elastic deformation of the hook part, a pressing force toward the circuit board is applied to the plurality of second contact parts of the cover.

* * * * *